United States Patent
Park et al.

(10) Patent No.: US 11,322,346 B2
(45) Date of Patent: May 3, 2022

(54) CLEANING SUBSTRATE METHOD AND METHOD OF PROCESSING SUBSTRATE USING THE SAME

(71) Applicant: Samsung Electronics Co., Ltd., Suwon-si (KR)

(72) Inventors: Yeongbong Park, Yongin-si (KR); Jisu Kim, Seoul (KR); Byoungho Kwon, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/336,924

(22) Filed: Jun. 2, 2021

(65) Prior Publication Data
US 2022/0093391 A1  Mar. 24, 2022

(30) Foreign Application Priority Data
Sep. 18, 2020 (KR) .................. 10-2020-0120840

(51) Int. Cl.
| | | |
|---|---|---|
| H01L 21/02 | (2006.01) | |
| H01L 21/306 | (2006.01) | |
| B08B 3/02 | (2006.01) | |
| B08B 3/08 | (2006.01) | |
| B05B 1/14 | (2006.01) | |
| B08B 1/00 | (2006.01) | |
| B08B 1/04 | (2006.01) | |
| B08B 1/02 | (2006.01) | |
| B24B 37/34 | (2012.01) | |
| B08B 3/04 | (2006.01) | |

(52) U.S. Cl.
CPC .......... *H01L 21/02057* (2013.01); *B05B 1/14* (2013.01); *B08B 1/002* (2013.01); *B08B 1/02* (2013.01); *B08B 1/04* (2013.01); *B08B 3/022* (2013.01); *B08B 3/024* (2013.01); *B08B 3/041* (2013.01); *B08B 3/08* (2013.01); *B24B 37/34* (2013.01); *H01L 21/30625* (2013.01)

(58) Field of Classification Search
CPC combination set(s) only.
See application file for complete search history.

(56) References Cited

U.S. PATENT DOCUMENTS

| | | |
|---|---|---|
| 6,417,497 B2 | 7/2002 | Nomura et al. |
| 8,567,420 B2 | 10/2013 | Inukai et al. |
| 9,142,399 B2 | 9/2015 | Ishibashi |
| 9,595,434 B2 | 3/2017 | Kim et al. |
| 10,388,537 B2 | 8/2019 | Kim et al. |
| 10,395,951 B2 | 8/2019 | Kim et al. |
| 10,553,421 B2 | 2/2020 | Ishida et al. |

(Continued)

FOREIGN PATENT DOCUMENTS

| | | |
|---|---|---|
| JP | 2960125 B2 | 10/1999 |
| JP | 2001007004 A | 1/2001 |

(Continued)

*Primary Examiner* — Erin F Bergner
(74) *Attorney, Agent, or Firm* — Myers Bigel, P.A.

(57) ABSTRACT

A method of processing a substrate may include preparing the substrate, polishing the substrate, and cleaning the substrate using a double nozzle, which is configured to provide a spray and a chemical solution onto the substrate. The spray may include a deionized water, and the chemical solution may be diluted with the deionized water. The chemical solution and the spray may be spaced apart from each other by a distance of 7 cm to 12 cm.

18 Claims, 16 Drawing Sheets

(56) References Cited

U.S. PATENT DOCUMENTS

| | | |
|---|---|---|
| 2007/0269207 A1 | 11/2007 | Minamida et al. |
| 2010/0051109 A1 | 3/2010 | Meier |
| 2010/0154826 A1* | 6/2010 | Printz ............... H01L 21/67253 |
| | | 134/18 |
| 2013/0255728 A1 | 10/2013 | Noh |
| 2014/0190633 A1 | 7/2014 | Maeda et al. |
| 2014/0373877 A1 | 12/2014 | Inoue et al. |
| 2015/0078870 A1 | 3/2015 | Dauendorffer et al. |
| 2015/0096682 A1 | 4/2015 | Nakashima |
| 2016/0027637 A1* | 1/2016 | Kim .................. H01L 21/02068 |
| | | 438/113 |
| 2017/0242340 A1 | 8/2017 | Jang et al. |
| 2017/0301553 A1* | 10/2017 | Kim .................. H01L 21/67046 |
| 2020/0135502 A1 | 4/2020 | Tanaka |

FOREIGN PATENT DOCUMENTS

| | | |
|---|---|---|
| JP | 5284004 B2 | 6/2013 |
| JP | 6123629 B2 | 4/2017 |
| KR | 100255379 B1 | 5/2000 |
| KR | 100310764 B1 | 12/2001 |
| KR | 100640990 B1 | 6/2002 |
| KR | 20090109383 A | 10/2009 |
| KR | 20100078192 A | 7/2010 |
| KR | 101176242 B1 | 8/2012 |
| KR | 101330319 B1 | 11/2013 |
| KR | 20150018453 A | 2/2015 |
| KR | 20150041587 A | 4/2015 |
| KR | 20170097833 A | 8/2017 |
| KR | 20190014463 A | 2/2019 |
| KR | 20190040922 A | 4/2019 |
| KR | 102040716 B1 | 11/2019 |
| KR | 102049326 B1 | 11/2019 |
| KR | 102095223 B1 | 3/2020 |
| KR | 102112763 B1 | 6/2020 |
| KR | 102120747 B1 | 6/2020 |
| KR | 102126942 B1 | 6/2020 |
| KR | 20200083790 A | 7/2020 |
| KR | 20200091549 A | 7/2020 |
| KR | 20200095074 A | 8/2020 |
| KR | 20200095975 A | 8/2020 |

* cited by examiner

CLEANING SUBSTRATE METHOD AND METHOD OF PROCESSING SUBSTRATE USING THE SAME

CROSS-REFERENCE TO RELATED APPLICATIONS

This U.S. non-provisional patent application claims priority under 35 U.S.C. § 119 to Korean Patent Application No. 10-2020-0120840, filed on Sep. 18, 2020, in the Korean Intellectual Property Office, the entire contents of which are hereby incorporated by reference.

BACKGROUND OF THE INVENTION

The present disclosure relates to a method of processing a substrate, and in particular, to a substrate cleaning method, which is performed to remove particles from a substrate after a chemical mechanical polishing process, and a method of manufacturing a semiconductor device using the same.

A semiconductor device is manufactured through a plurality of unit processes. The unit processes include a film deposition process, a chemical mechanical polishing process, a photolithography process, an etching process, an ion implantation process, and a substrate cleaning process. The substrate cleaning process is a unit process of removing particles from a surface of a substrate. Particles may be produced on the substrate during the chemical mechanical polishing process. Thus, the substrate cleaning process should be performed at least after the chemical mechanical polishing process.

SUMMARY

Embodiments of the inventive concept provide a substrate cleaning method capable of improving particle removal efficiency and a method of processing a substrate using the same.

According to an embodiment of the inventive concept, a method of processing a substrate may include preparing the substrate, polishing the substrate, and cleaning the substrate using a double nozzle, which is configured to provide a spray and a chemical solution onto the substrate. The spray may contain or include a deionized water, and the chemical solution may be diluted with the deionized water. The chemical solution and the spray may be spaced apart from each other by a distance of 7 cm to 12 cm.

According to an embodiment of the inventive concept, a method of cleaning a substrate may include moving a double nozzle including a high-pressure nozzle configured to provide a spray and a low-pressure nozzle configured to provide a chemical solution onto the substrate at a first speed on a center region of the substrate, the spray containing or including a deionized water and the chemical solution being diluted with the deionized water, and moving the double nozzle at a second speed, which is slower than the first speed, on an edge region of the substrate outside and surrounding the center region of the substrate. The low-pressure nozzle and the high-pressure nozzle may be spaced apart from each other by a distance of 7 cm to 12 cm.

According to an embodiment of the inventive concept, a method of processing a substrate may include preparing the substrate, polishing the substrate, and cleaning the substrate. The cleaning of the substrate may include cleaning the substrate using a first double nozzle, which is configured to provide a first spray and a first chemical solution onto the substrate, the first spray containing or including a deionized water, the first chemical solution being diluted with the deionized water, brushing the substrate using a brush and a second chemical solution, which is different from the first chemical solution, on the substrate, and recleaning the substrate using a second double nozzle, which is configured to provide a second spray and a third chemical solution onto the substrate, which are the same as the first spray and the first chemical solution, respectively. A distance between the first chemical solution and the first spray and a distance between the second spray and the third chemical solution may each be in a range of 7 cm to 12 cm.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
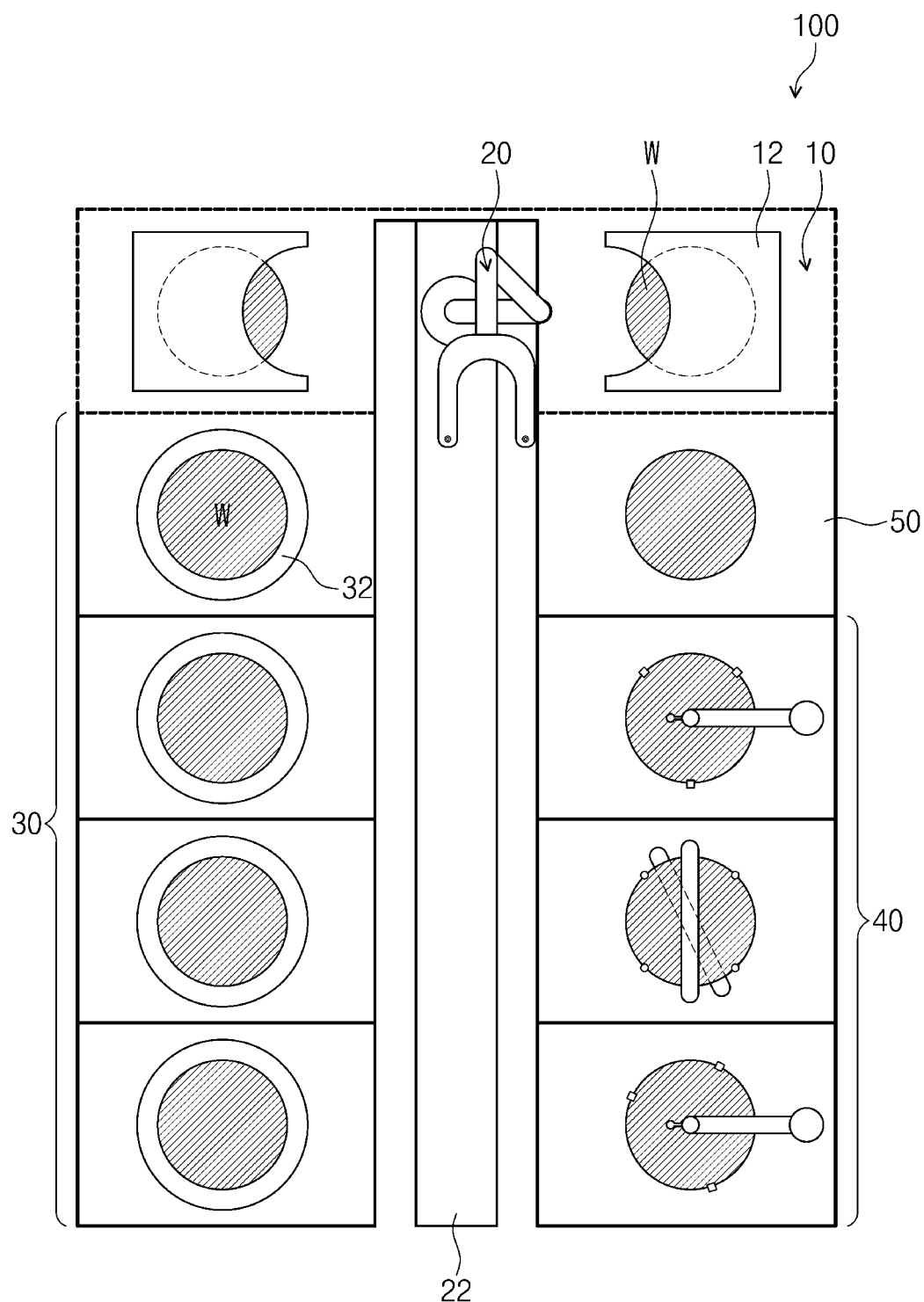
FIG. 1 is a diagram illustrating an example of a system of manufacturing a semiconductor device.

FIG. 1 illustrates an example of a substrate processing system 100 according to an embodiment of the inventive concept.

Referring to FIG. 1, the substrate processing system 100 according to an embodiment of the inventive concept may be a semiconductor device manufacturing system. For example, the substrate processing system 100 may include a chemical mechanical polishing system. In an embodiment, the substrate processing system 100 may include a wet cleaning system, but the inventive concept is not limited to this example. As an example, the substrate processing system 100 may include a carrier loading unit or system 10, a substrate transfer unit or system 20, a polishing unit or system 30, a cleaning unit or system 40, and a drying unit or system 50.

The carrier loading unit 10 may be contained in or include a carrier 12. The substrate transfer unit 20 may transfer a substrate W, which is placed in the carrier 12, to the polishing unit 30, the cleaning unit 40, or the drying unit 50. The substrate transfer unit 20 may include a robot arm, which is configured to move along a guide rail 22. The guide rail 22 may be disposed between the polishing unit 30 and the cleaning unit 40. The polishing unit 30 may include a plurality of polishing pads 32. Each of the polishing pads 32 may be used to polish a substrate W. The cleaning unit 40 may be used to clean the polished surface of the substrate W. The drying unit 50 may be used to dry the substrate W, on which the cleaning step is performed. After the drying step, the substrate W may be placed again in the carrier 12 by the substrate transfer unit 20.

Figure 2:
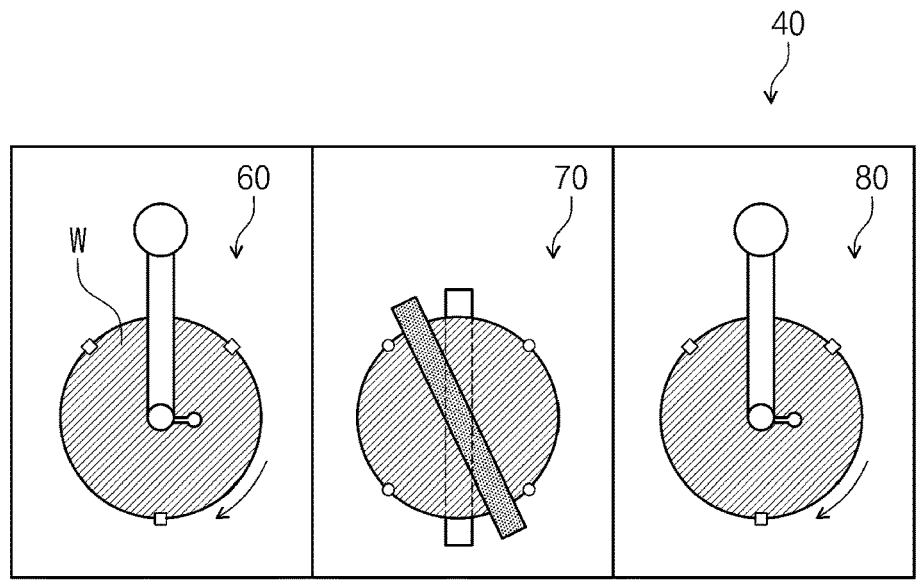
FIG. 2 is a plan view illustrating an example of a cleaning unit of FIG. 1.

FIG. 2 illustrates an example of the cleaning unit 40 of FIG. 1.

Referring to FIGS. 1 and 2, the cleaning unit 40 may be a deionized-water-based cleaning unit. As an example, the cleaning unit 40 may include a first cleaning portion 60, a second cleaning portion 70, and a third cleaning portion 80. The first cleaning portion 60, the second cleaning portion 70, and the third cleaning portion 80 may be used to sequentially remove a particle (e.g., 11 in FIG. 5) from the substrate W.

Figure 3:
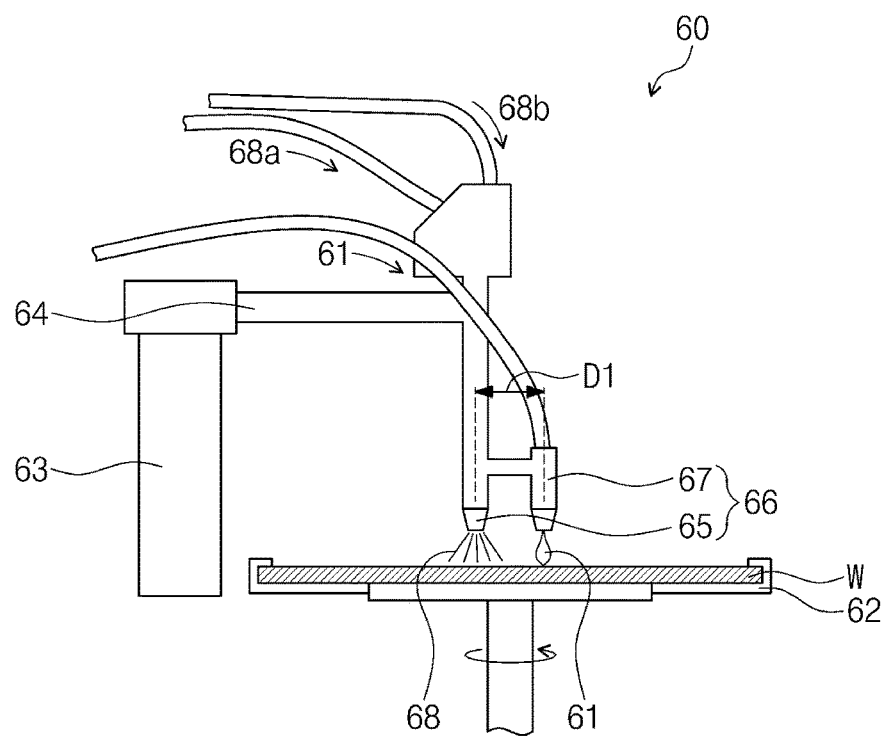
FIG. 3 is a diagram illustrating an example of a first cleaning portion of FIG. 2.

FIG. 3 illustrates an example of the first cleaning portion 60 of FIG. 2.

Referring to FIG. 3, the first cleaning portion 60 may clean the substrate W using a first chemical solution 61 and a first spray 68. As an example, the first cleaning portion 60 may include a first chuck 62, a first shaft 63, a first arm 64, and a first double nozzle 66.

The first chuck 62 may clamp the substrate W. The first chuck 62 may be configured to rotate the substrate W. For example, the first chuck 62 may rotate the substrate W at a rotation speed of about 60 rpm to about 1000 rpm.

The first shaft 63 may be disposed adjacent to the first chuck 62. The first shaft 63 may be connected to the first arm 64. The first shaft 63 may rotate the first arm 64 such that the first double nozzle 66 is moved from a center of the substrate W to an edge of the substrate W.

The first arm 64 may connect the first double nozzle 66 to the first shaft 63. As a result of the rotation of the first shaft 63, the first arm 64 may move the first double nozzle 66 to a region on the substrate W.

The first double nozzle 66 may provide the first chemical solution 61 and the first spray 68 onto the substrate W. As an example, the first double nozzle 66 may include a first high-pressure nozzle 65 and a first low-pressure nozzle 67.

The first high-pressure nozzle 65 may be connected to the first arm 64. The first high-pressure nozzle 65 may be a jet spray nozzle or a two-fluid nozzle. The first high-pressure nozzle 65 may provide the first spray 68 onto the substrate W. The first spray 68 may include a first solution 68a and a first carrier gas 68b. The first solution 68a may contain deionized (DI) water, carbonated water, or isopropyl alcohol (IPA). The first solution 68a may be provided at a flow rate of about 200 liter per minute (lpm) to about 250 lpm. The first carrier gas 68b may be used to produce the first spray 68 from the first solution 68a. The first carrier gas 68b may contain a nitrogen (N2) gas. The first carrier gas 68b may be provided at a flow rate of about 100 lpm to about 140 lpm. The first spray 68 may be provided on the substrate W with a pressure of about 2 atm to about 10 atm.

The first low-pressure nozzle 67 may be connected to the first high-pressure nozzle 65. For example, the first high-pressure nozzle 65 and the first low-pressure nozzle 67 may be spaced apart from each other by a first distance D1 of about 3 cm to about 12 cm. As an example, the first low-pressure nozzle 67 may be a droplet nozzle. The first low-pressure nozzle 67 may provide the first chemical solution 61 onto the substrate W. The pressure of the first chemical solution 61 may be lower than the pressure of the first spray 68. The first chemical solution 61 may have a flow rate of 50 cubic centimeter per minute (cpm) to 800 cpm and a pressure of 1 atm or atmospheric pressure. The first chemical solution 61 may contain acidic solution. The first chemical solution 61 may contain hydrofluoric acid (HF). The hydrofluoric acid may have a weight percent of 0.1 wt % to 2 wt %. The first chemical solution 61 may be dissolved in the first solution 68a or in the first spray 68.

Figure 4:
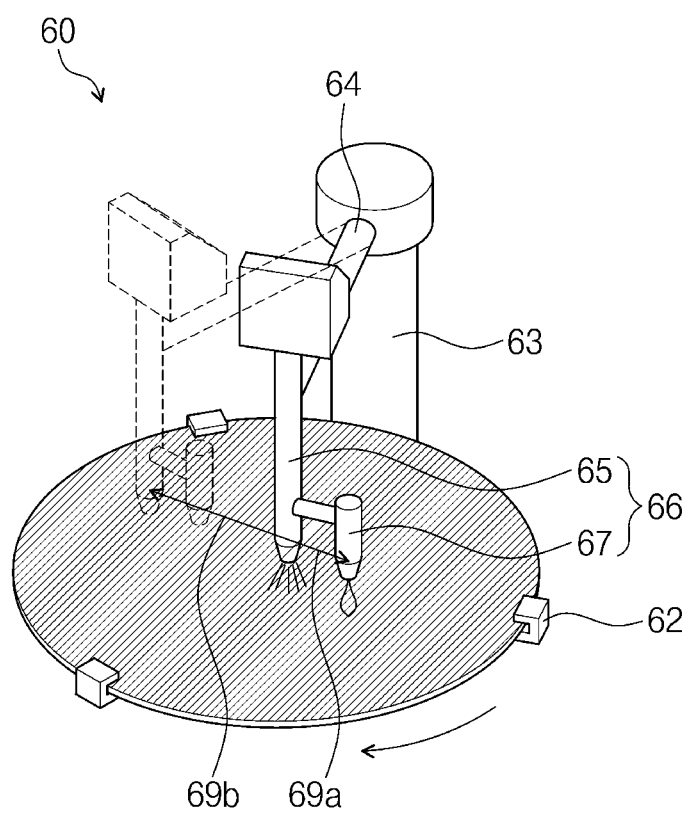
FIG. 4 is a perspective view illustrating a movement of a first high-pressure nozzle and a first low-pressure nozzle of FIG. 3.

FIG. 4 illustrates a movement of the first high-pressure nozzle 65 and the first low-pressure nozzle 67 of FIG. 3.

Referring to FIG. 4, the first low-pressure nozzle 67 may be connected to the first high-pressure nozzle 65 in a first direction 69a (which may be a lateral or radial direction). The first low-pressure nozzle 67 and the first high-pressure nozzle 65 may be moved in a second direction 69b (which may be a lateral or radial direction) by the first arm 64. The first direction 69a may be opposite to the second direction 69b.

The first chemical solution 61 and the first spray 68 may be provided on a region from the center of the substrate W to the edge of the substrate W in the second direction 69b. The first chemical solution 61 and the first spray 68 may be gradually scattered in the second direction 69b. Here, the second direction 69b may be defined as a direction, in which the first spray 68 proceeds ahead of the first chemical solution 61. The first chemical solution 61 and the first spray 68 proceeding in the second direction 69b may have particle removal efficiency higher than that of proceeding in the first direction 69a. For example, the first chemical solution 61 and the first spray 68 moving in the second direction 69b may have the particle removal efficiency of about 92%, and the first chemical solution 61 and the first spray 68 moving in the first direction 69a may have the particle removal efficiency of about 85%.

Figure 5:
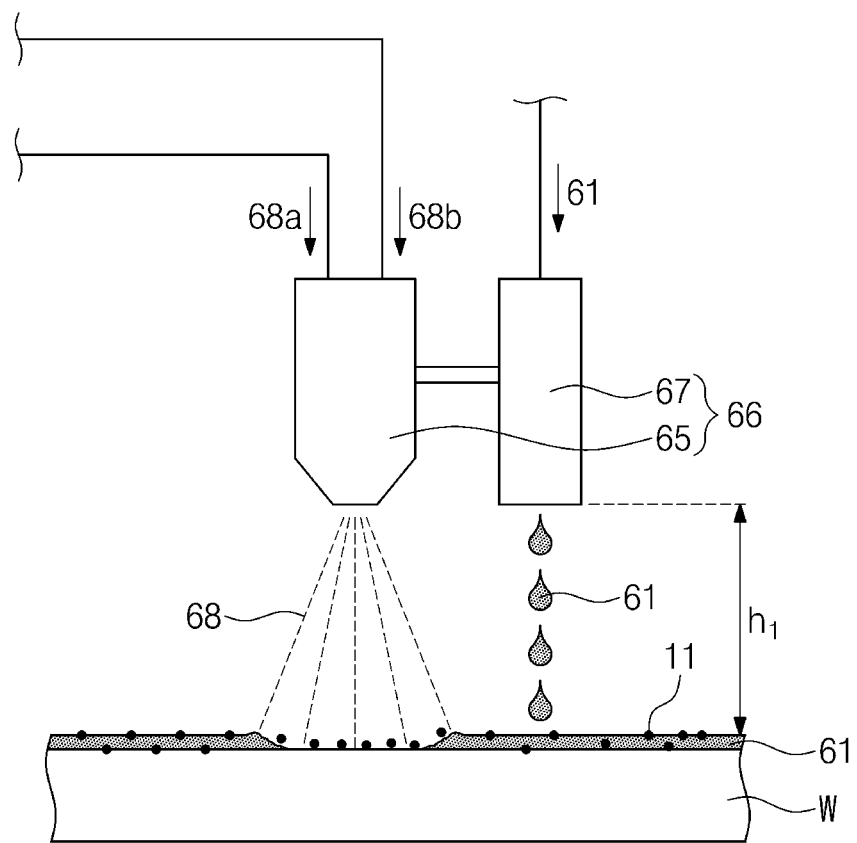
FIG. 5 is a side view illustrating an example of the first high-pressure nozzle and the first low-pressure nozzle of FIG. 3.

FIG. 5 illustrates an example of the first high-pressure nozzle 65 and the first low-pressure nozzle 67 of FIG. 3.

Referring to FIG. 5, the first high-pressure nozzle 65 and the first low-pressure nozzle 67 may be placed at a first height h1 from the substrate W. For example, the first height h1 may be about 5 cm.

The first spray 68 may be ejected with a high pressure to lift a particle 11 from the substrate W. Alternatively, the top surface of the substrate W may be at least partially wet by the first spray 68. The first spray 68 may be dissolved in the first chemical solution 61.

The first chemical solution 61 may be dropped on the substrate W. The first chemical solution 61 may lift the particle 11 from the top surface of the substrate W. The top surface of the substrate W may be formed of silicon oxide. The particles 11 may include polishing agent particles, silicon oxide particles, or metal particles. The lifted particle 11 and the first chemical solution 61 may be removed from the substrate W by rotation of the first chuck 62. Alternatively, the lifted particle 11 and the first chemical solution 61 may be removed by a hitting force from the first spray 68, but the inventive concept is not limited to this example.

Figure 6:
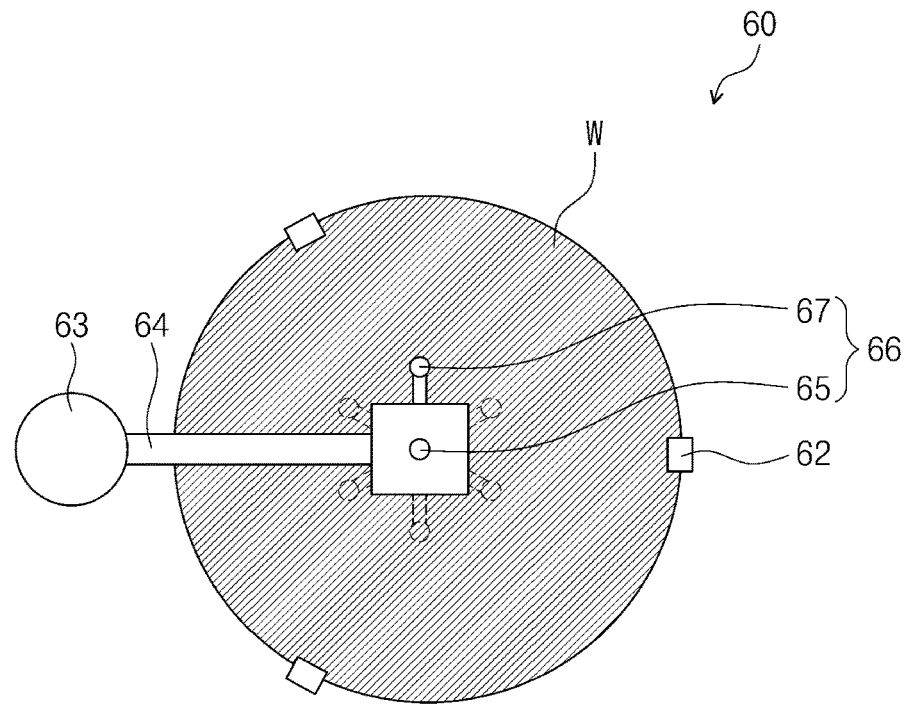
FIG. 6 is a plan view illustrating an example of the first high-pressure nozzle and the first low-pressure nozzle of FIG. 3.

FIG. 6 illustrates an example of the first high-pressure nozzle 65 and the first low-pressure nozzle 67 of FIG. 3.

Referring to FIG. 6, the first low-pressure nozzle 67 of the first double nozzle 66 may be rotated about the first high-pressure nozzle 65. The first low-pressure nozzle 67 may be rotated about the first high-pressure nozzle 65 by about 360°. The first chuck 62, the first shaft 63, and the first arm 64 may be configured in the same manner as those in FIG. 3.

Figure 7:
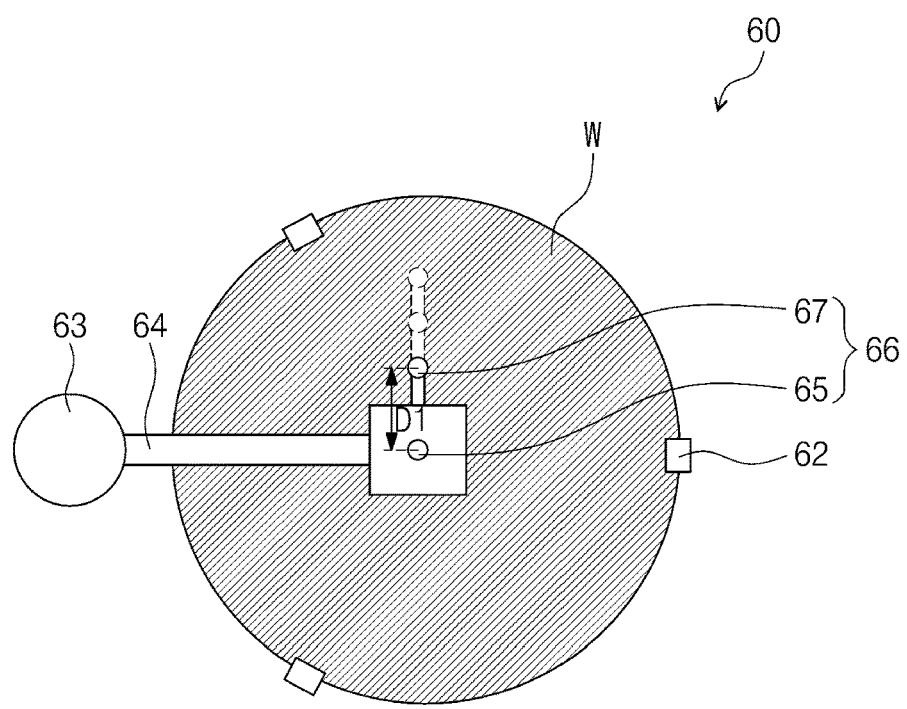
FIG. 7 is a plan view illustrating an example of the first high-pressure nozzle and the first low-pressure nozzle of FIG. 3.

FIG. 7 illustrates an example of the first high-pressure nozzle 65 and the first low-pressure nozzle 67 of FIG. 3.

Referring to FIG. 7, the first distance D1 between the first high-pressure nozzle 65 and the first low-pressure nozzle 67 may be changed. For example, the first distance D1 may be changed from about 3 cm to about 12 cm.

Figure 8:
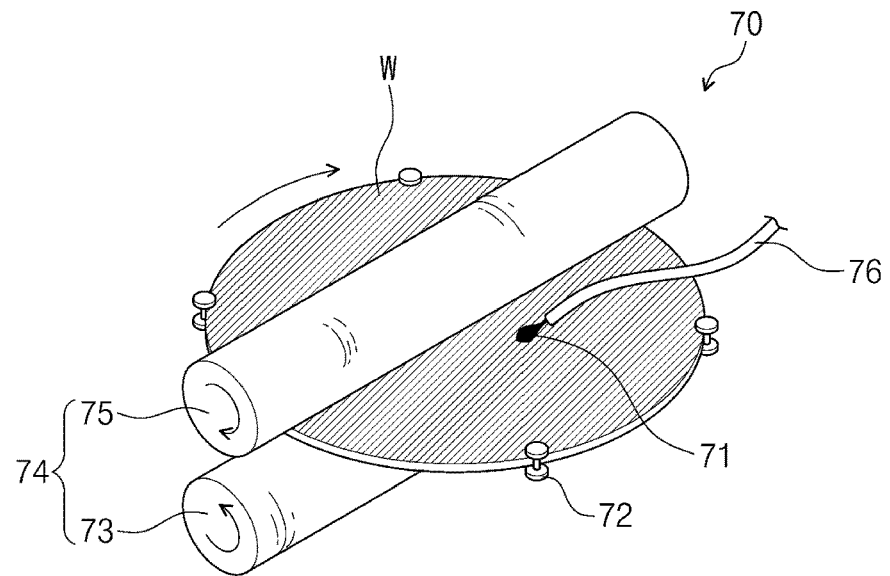
FIG. 8 is a perspective view illustrating an example of a second cleaning portion of FIG. 2.

FIG. 8 illustrates an example of the second cleaning portion 70 of FIG. 2.

Referring to FIGS. 2, 5, and 8, the second cleaning portion 70 may be configured to brush the substrate W or to remove the particle 11 from the substrate W.

As an example, the second cleaning portion 70 may include a plurality of rollers 72, a plurality of brushes 74, and a single nozzle 76.

The rollers 72 may be disposed at or near the edge of the substrate W. For example, four rollers 72 may be spaced apart from the edge of the substrate W by a specific distance. The rollers 72 may be configured to rotate the substrate W.

The brushes 74 may separate the particles 11 from the substrate W. For example, the brushes 74 may include a lower brush 73 and an upper brush 75. The substrate W may be disposed between the lower brush 73 and the upper brush 75. The lower brush 73 may be disposed below the substrate W. The upper brush 75 may be disposed on or above the substrate W. The lower brush 73 and the upper brush 75 may be rotated in opposite directions. The upper brush 75 may remove the particle 11 on the substrate W. For example, the upper brush 75 may remove particles, such as polishing agent particles.

The single nozzle 76 may provide a second chemical solution 71 on the substrate W. For example, the second chemical solution 71 may contain an alkaline solution of ammonia water. The ammonia water may have a weight percent of 0.1 wt % to 4 wt %. The second chemical solution 71 may prevent the particle 11 from being adsorbed on the substrate W.

Figure 9:
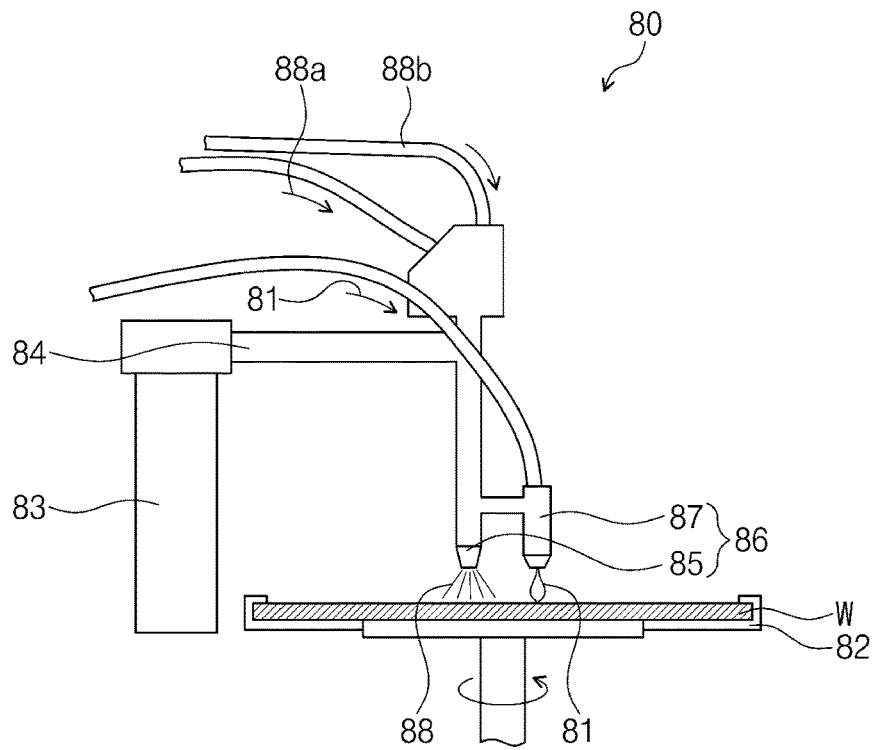
FIG. 9 is a side view illustrating an example of a third cleaning portion of FIG. 2.

FIG. 9 illustrates an example of the third cleaning portion 80 of FIG. 2.

Referring to FIG. 9, the third cleaning portion 80 may be similar to the first cleaning portion 60 of FIG. 3. The third cleaning portion 80 may clean the substrate W using a third chemical solution 81 and a second spray 88. As an example, the third cleaning portion 80 may include a second chuck 82, a second shaft 83, a second arm 84, and a second double nozzle 86.

The second chuck 82 may clamp the substrate W. The second chuck 82 may be configured to rotate the substrate W. For example, the second chuck 82 may rotate the substrate W at a rotation speed of about 60 rpm to about 1000 rpm.

The second shaft 83 may be disposed adjacent to the second chuck 82. The second shaft 83 may be connected to the second arm 84. The second shaft 83 may rotate the second arm 84 to move the second double nozzle 86 from the center of the substrate W to the edge of the substrate W.

The second arm 84 may connect the second double nozzle 86 to the second shaft 83. In other words, an end of the second arm 84 may be connected to the second shaft 83, and an opposite end of the second arm 84 may be connected to the second double nozzle 86. The second arm 84 may move the second double nozzle 86 to a position on the substrate W, as a result of the rotation of the second shaft 83.

The second double nozzle 86 may provide the third chemical solution 81 and the second spray 88 on the substrate W. For example, the second double nozzle 86 may be configured to provide the third chemical solution 81 and the second spray 88 on the substrate W with a height difference of about 5 cm above the substrate W. As an example, the second double nozzle 86 may include a second high-pressure nozzle 85 and a second low-pressure nozzle 87.

The second high-pressure nozzle 85 may be connected to the second arm 84. The second high-pressure nozzle 85 may be a jet spray nozzle or a two-fluid nozzle. The second high-pressure nozzle 85 may provide the second spray 88 on the substrate W. The second spray 88 may have the same pressure as the first spray 68. For example, the second spray 88 may have a pressure of about 2 atm to about 10 atm. The second spray 88 may include a second solution 88a and a second carrier gas 88b. The second solution 88a may be the same as the first solution 68a. The second solution 88a may contain deionized water, carbonated water, or isopropyl alcohol. The second solution 88a may be supplied at a flow rate of about 200 lpm (liter per minute) to about 250 lpm. The second carrier gas 88b may be the same as the first carrier gas 68b. The second carrier gas 88b may contain a nitrogen gas. The second carrier gas 88b may be supplied at a flow rate of about 100 lpm to about 140 lpm. The second spray 88 may be provided on the substrate W with a pressure of about 2 atm to about 10 atm.

The second low-pressure nozzle 87 may be connected to the second high-pressure nozzle 85. In an embodiment, the second high-pressure nozzle 85 and the second low-pressure nozzle 87 may be spaced apart (e.g., laterally or radially) from each other by a distance of about 3 cm to about 12 cm. The second low-pressure nozzle 87 may provide the third chemical solution 81 on the substrate W. The pressure of the third chemical solution 81 may be lower than the pressure of the second spray 88. The third chemical solution 81 may be the same as the second chemical solution 71. For example, the third chemical solution 81 may contain alkaline solution. The third chemical solution 81 may contain ammonia water. The flow rate and pressure of the third chemical solution 81 may be substantially the same as those of the first chemical solution 61. For example, the third chemical solution 81 may have a flow rate of 50 cpm to about 800 cpm and a pressure of the atmospheric pressure. The third chemical solution 81 may be dissolved in the second solution 88a or the second spray 88.

A method of processing a substrate using the substrate processing system 100 will be described in more detail below.

Figure 10:
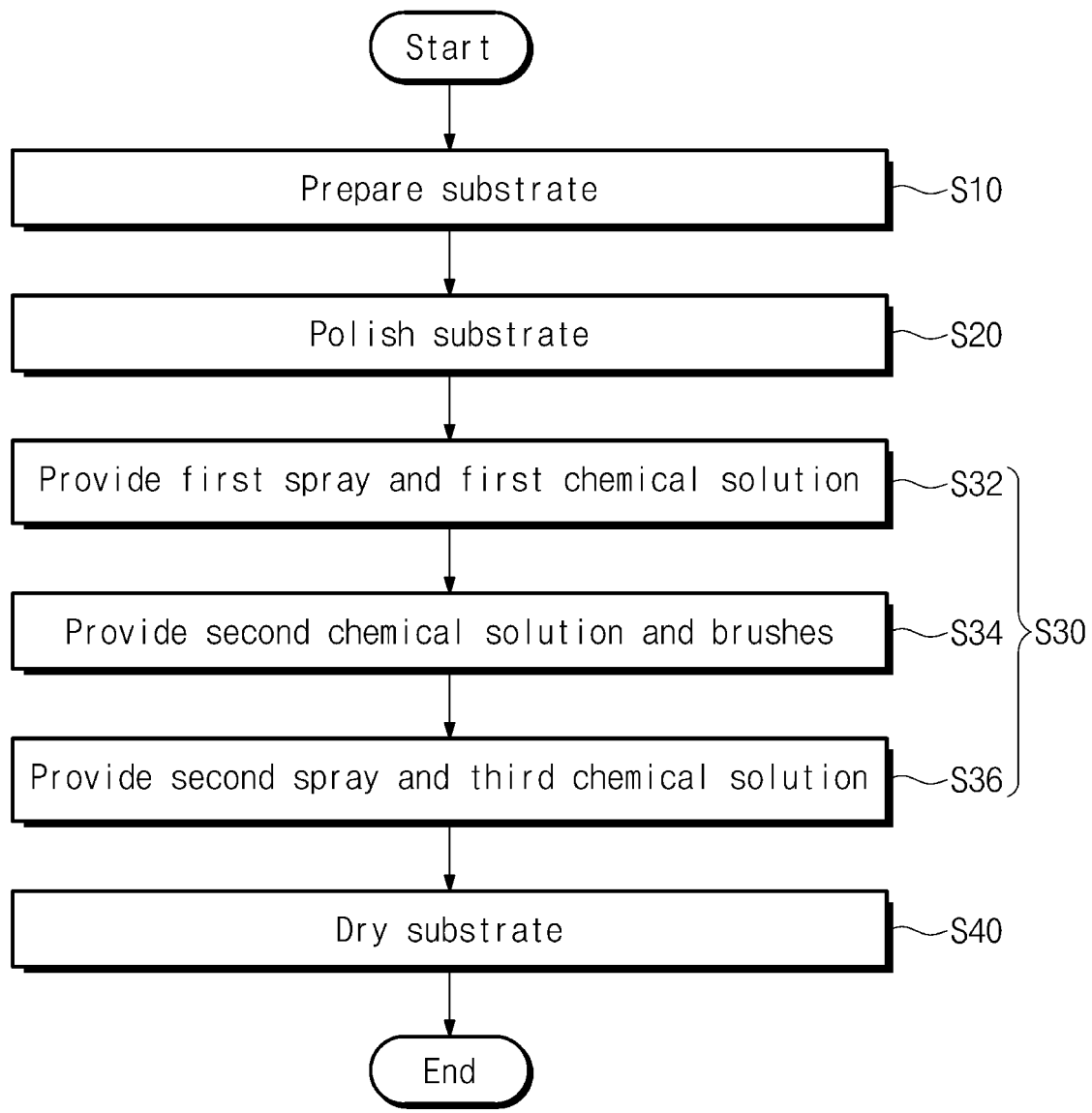
FIG. 10 is a flow chart illustrating a method of processing a substrate, using a substrate processing system according to an embodiment of the inventive concept.

FIG. 10 illustrates a method of processing a substrate, using the substrate processing system 100 according to an embodiment of the inventive concept.

Referring to FIG. 10, a semiconductor device manufacturing system may prepare a substrate W using a plurality of unit processes (in S10). The substrate W may be prepared to have a semiconductor device. For example, the semiconductor device may be or include a memory device, a solid-state drive (SSD), or an application processor (AP). Alternatively, the semiconductor device may include active elements (e.g., transistors and diodes) or passive elements (e.g., capacitors and resistors). The substrate W may be provided in the polishing unit 30 through the carrier 12, the carrier loading unit 10, and the substrate transfer unit 20.

Referring to FIGS. 1 and 10, the polishing unit 30 of the substrate processing system 100 may polish the substrate W using a chemical mechanical polishing method (in S20). The substrate W may be polished to have a flat surface. Although not shown, a polishing target layer of the substrate W may include an interlayer insulating layer (e.g., a silicon oxide layer). Alternatively, the polishing target layer of the substrate W may include a metal layer (e.g., a copper layer). The substrate transfer unit 20 may transfer the substrate W to the cleaning unit 40.

Referring to FIGS. 2 to 10, the cleaning unit 40 may clean the substrate W (in S30). The substrate W may be cleaned in a wet manner. As an example, the cleaning of the substrate W (in S30) may include providing the first spray 68 and the first chemical solution 61 on the substrate W (in S32), providing the second chemical solution 71 and the brushes 74 (in S34), and providing the second spray 88 and the third chemical solution 81 (in S36).

Referring to FIGS. 3 to 7 and 10, if the substrate W is loaded on the first chuck 62, the first double nozzle 66 may provide the first spray 68 and the first chemical solution 61 on the substrate W (in S32). The first chuck 62 may rotate the substrate W at a rotation speed of about 100 rpm to about 1000 rpm. The substrate W may be rotated in a clockwise direction. Alternatively, the substrate W may be rotated in a counterclockwise direction, but the inventive concept is not limited to this example. The first chemical solution 61 may be provided with a pressure that is lower than the first spray 68. The first spray 68 may be provided with a pressure of about 2 atm to about 10 atm. The first chemical solution 61 may be provided with a pressure of 1 atm. The first spray 68 may be provided from the center of the substrate W to the edge of the substrate W. The first chemical solution 61 may proceed ahead of the first chemical solution 61 in the second direction 69b. The first spray 68 and the first chemical solution 61 may lift the particle 11 from the substrate W. The lifted particle 11 may be removed by rotation of the substrate W.

Figure 11:
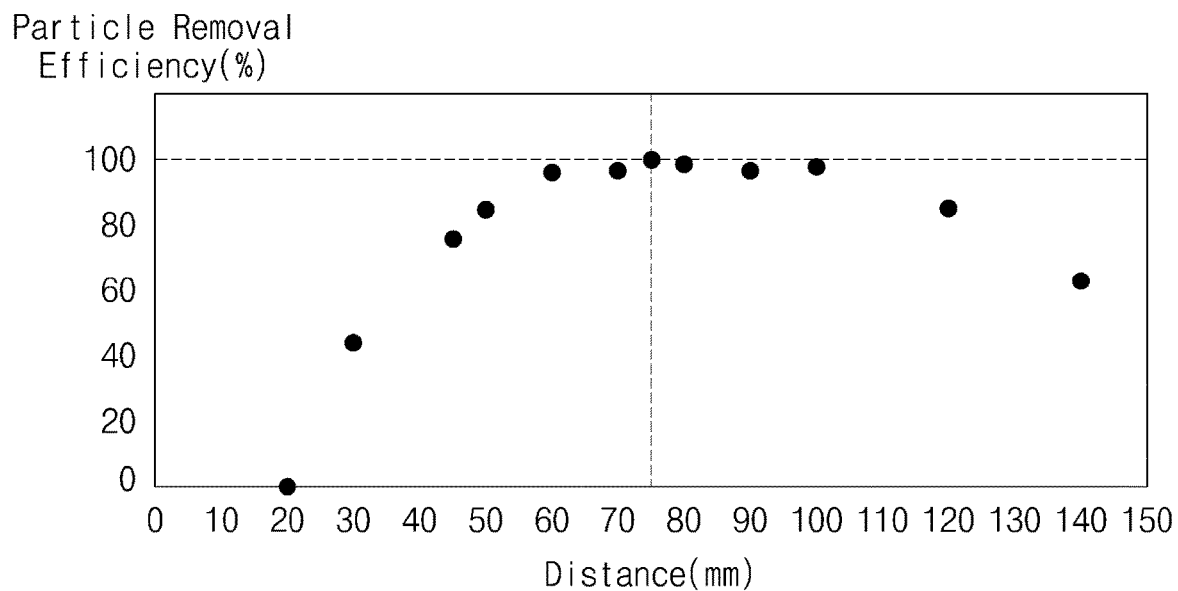
FIG. 11 is a graph showing particle removal efficiency according to a first distance between a first spray and a first chemical solution of FIG. 3.

FIG. 11 illustrates particle removal efficiency according to the first distance D1 between the first spray 68 and the first chemical solution 61 of FIG. 3.

Referring to FIG. 11, when the first distance D1 between the first spray 68 and the first chemical solution 61 is about 7.5 cm, the particle removal efficiency may be highest. The particle removal efficiency may be substantially about 100%. When the first distance D1 is within a range of about 5 cm to about 12 cm, the particle removal efficiency may be higher than or equal to about 80%. When the first distance D1 is beyond the range of about 4 cm to about 14 cm, the particle removal efficiency may be lower than or equal to about 60%.

Figure 12:
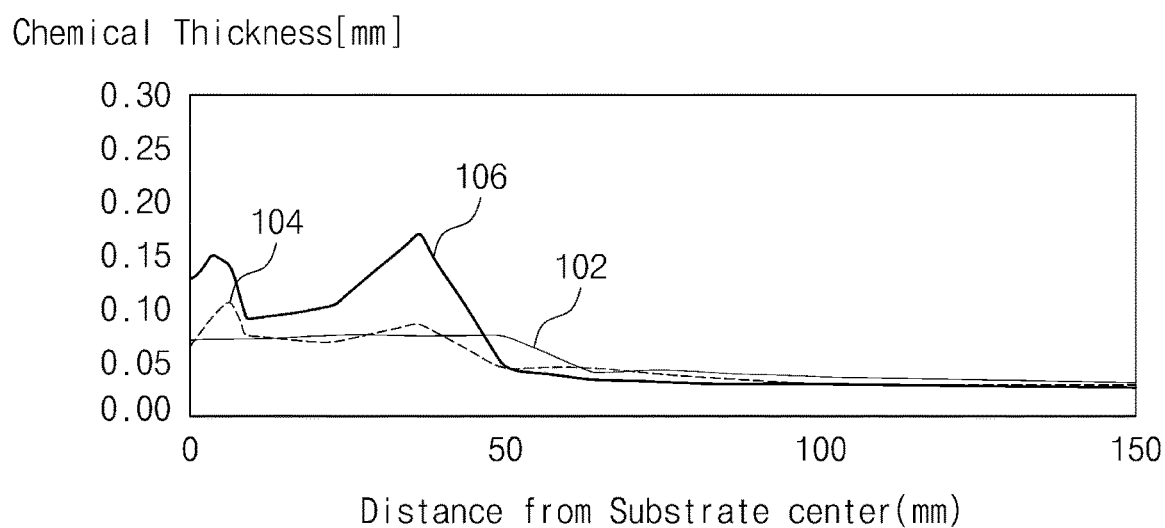
FIG. 12 is a graph showing a thickness of a cleaning solution according to the first distance between the first spray and the first chemical solution of FIG. 3.

FIG. 12 illustrates a thickness of a cleaning solution according to the first distance D1 between the first spray 68 and the first chemical solution 61 of FIG. 3.

Referring to FIG. 12, in the case where the first distance D1 is 7.5 cm (e.g., see the curve 102), the first chemical solution 61 may have a constant thickness in a region (e.g., from 0 to 50 mm) near the center of the substrate W. In the case where the first chemical solution 61 has a constant thickness, the uniformity of the particle removal efficiency may be increased.

In the case where the first distance D1 is 6.0 cm (e.g., see the curve 104), the first chemical solution 61 may have a thickness difference of about 0.05 mm in the region near the center of the substrate W. In the case where the first distance D1 is about 4.5 cm (e.g., see the curve 106), the first chemical solution 61 may have a thickness difference of about 0.1 mm in the region near the center of the substrate W. In the case where the thickness difference of the first chemical solution 61 is larger than 0.05 mm, the particle cleaning efficiency may have a difference between center and edge regions C and E of the substrate W (e.g., see FIG. 14). In the case where the first distance D1 is 6 cm or 4.5 cm (e.g., the curve 104 or 106), the uniformity of the particle cleaning efficiency may be reduced.

In the substrate cleaning method according to an embodiment of the inventive concept, the first spray 68 and the first chemical solution 61 (or the first high-pressure nozzle 65 and the first low-pressure nozzle 67) may be spaced apart from each other by the first distance D1 of about 7 cm to about 12 cm, and in this case, the particle cleaning efficiency may be increased.

Figure 13:
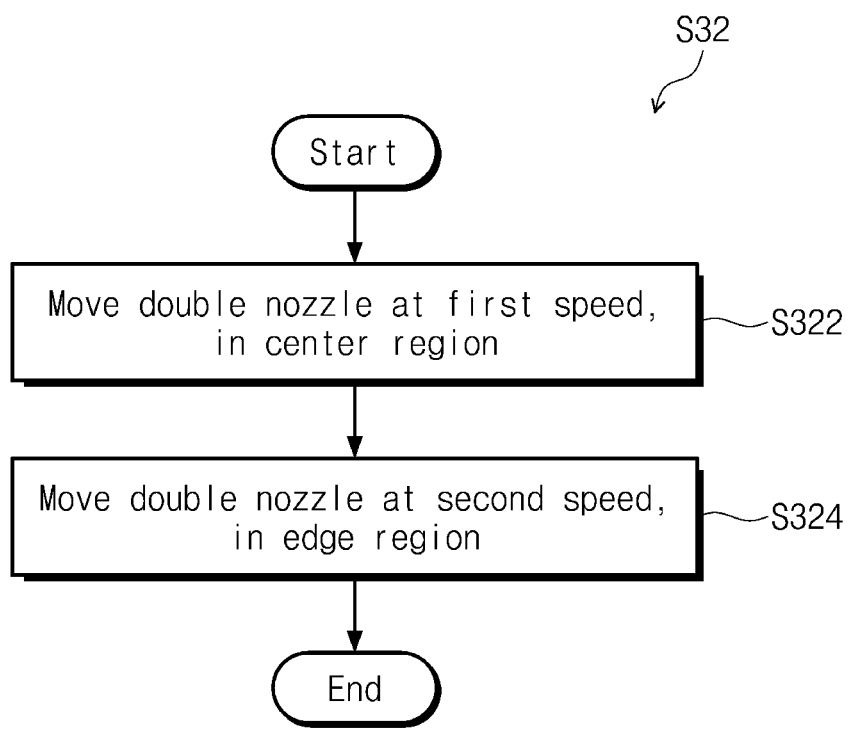
FIG. 13 is a flow chart illustrating an example of a step of providing the first spray and the first chemical solution of FIG. 3 on a substrate.
Figure 14:
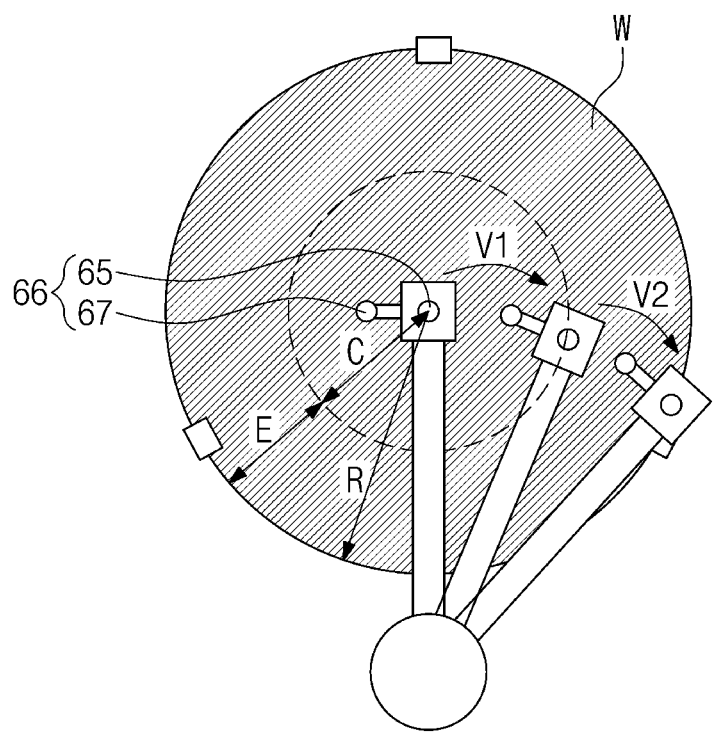
FIG. 14 is a plan view illustrating a first speed and a second speed at a center region and an edge region of the substrate of FIG. 3.
Figure 15:
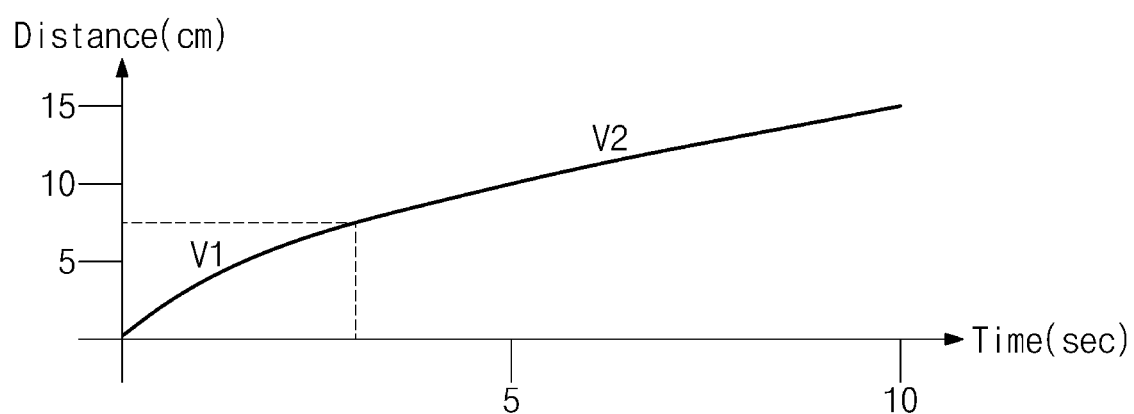
FIG. 15 is a graph showing an example of the first and second speeds of FIG. 14.

FIG. 13 illustrates an example of the step S32 of providing the first spray 68 and the first chemical solution 61 of FIG. 3 on the substrate W. FIG. 14 illustrates a first speed V1 and a second speed V2 at a center region C and an edge region E of the substrate W of FIG. 3. FIG. 15 illustrates an example of the first and second speeds V1 and V2 of FIG. 14. A vertical axis of FIG. 15 represents a radius of the substrate W.

Referring to FIG. 13, the providing of the first spray 68 and the first chemical solution 61 on the substrate W (in S32) may include providing the first spray 68 and the first chemical solution 61 in a non-uniform manner and/or with acceleration or deceleration.

Referring to FIGS. 3, 13, and 14, in the center region C of the substrate W, the first double nozzle 66 may move the first spray 68 and the first chemical solution 61 at the first speed V1 (in S322). The substrate W may have a radius (R) of about 150 cm. The center region C of the substrate W may be a circular region, which is concentric with and surrounds the center of the substrate W and has a radius of about 7.5 cm. The edge region E may be a remaining region of the substrate W which is located around the center region C. The edge region E may be a region, which spans from an outer edge of the center region C to the edge of the substrate W and is shaped like a circular hollow disk or ring.

Referring to FIG. 15, the first speed V1 may be faster than the second speed V2. In an embodiment, the first speed V1 may be an average movement speed of the first double nozzle 66 in the center region C. For example, the first speed V1 may be about 2.5 cm/sec. Alternatively, the first speed V1 may gradually decrease from the center of the substrate W to the edge of the center region C. The first speed V1 may be about 5.0 cm/sec at the center of the substrate W and about 1.2 cm/sec at the edge of the center region C.

Next, in the edge region E of the substrate W, the first double nozzle 66 may move the first spray 68 and the first chemical solution 61 at the second speed V2 (in S324). The second speed V2 may be smaller or slower than the first speed V1. The second speed V2 may be an average movement speed of the first double nozzle 66 in the edge region E. The second speed V2 may be about 1.1 cm/sec. Alternatively, the second speed V2 may gradually decrease from the edge of the center region C of the substrate W to the outer edge of the edge region E of the substrate W. The second speed V2 may be about 1.2 cm/sec at the edge of the center region C of the substrate W and about 1.0 cm/sec at the outer edge of the edge region E of the substrate W.

Figure 16:
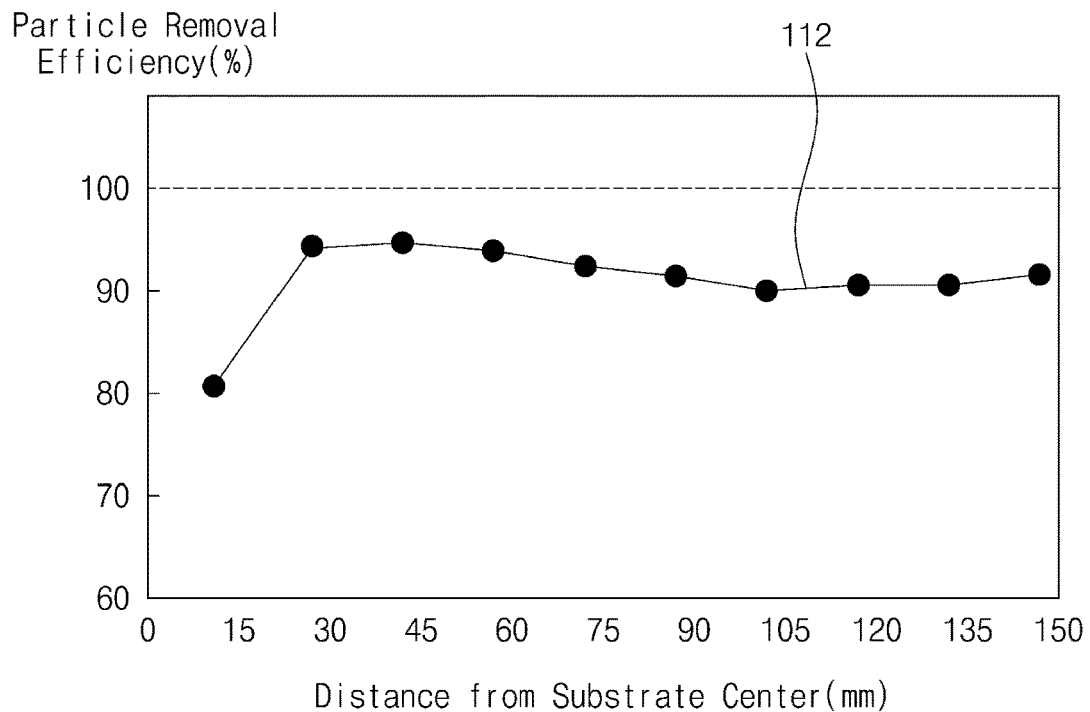
FIG. 16 is a graph showing cleaning efficiency in a conventional cleaning method performed at a constant moving speed in a uniform manner.
Figure 17:
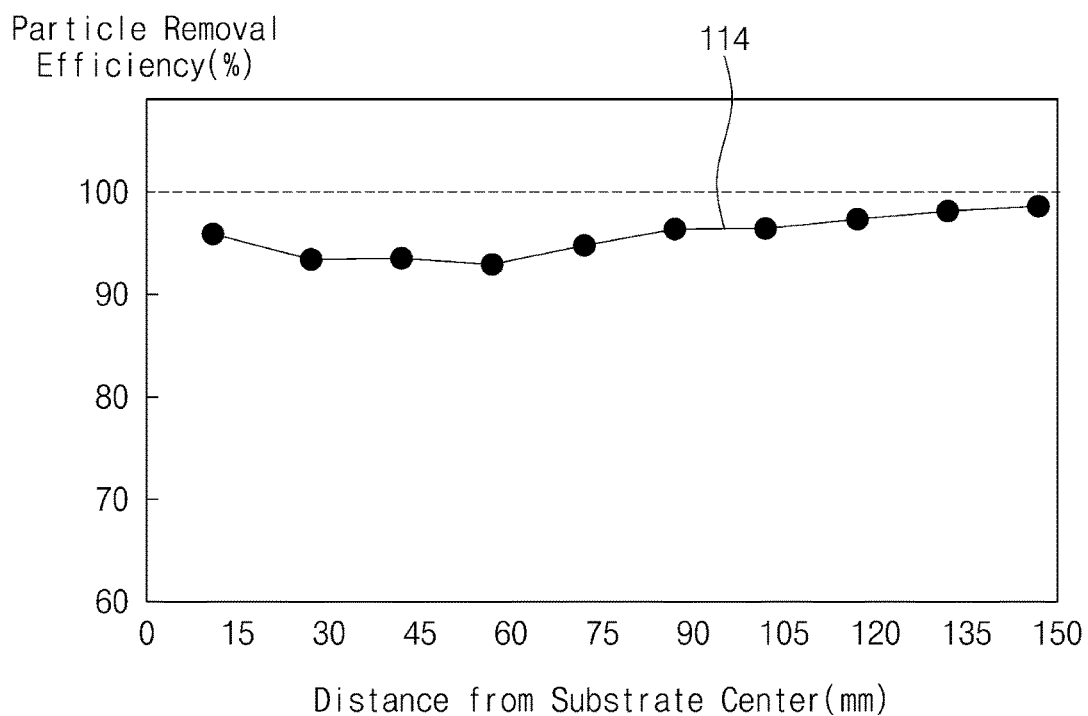
FIG. 17 is a graph showing cleaning efficiency in a cleaning method performed at a non-constant moving speed (e.g., the first and second speeds of FIG. 15) in a non-uniform manner.

FIG. 16 illustrates a cleaning efficiency 112 in a conventional cleaning method performed at a constant moving speed in a uniform manner. FIG. 17 illustrates a cleaning efficiency 114 in a cleaning method performed at a non-constant moving speed (e.g., the first and second speeds V1 and V2 of FIG. 15) in a non-uniform manner.

Referring to FIGS. 16 and 17, the non-constant speed cleaning efficiency 114 at the center region C of the substrate W in the method according to an embodiment of the inventive concept may be higher than the constant speed cleaning efficiency 112 in the conventional constant speed cleaning method. The non-constant speed cleaning efficiency 114 may have similar values, at the center region C and the edge region E of the substrate W. By contrast, the constant speed cleaning efficiency 112 may be significantly lower at the center region C of the substrate W than at the edge region E of the substrate W.

Thus, according to an embodiment of the inventive concept, by using a non-constant speed cleaning method of the first and second speeds V1 and V2, it may be possible to increase the particle removal efficiency in the substrate cleaning method.

Figure 18:
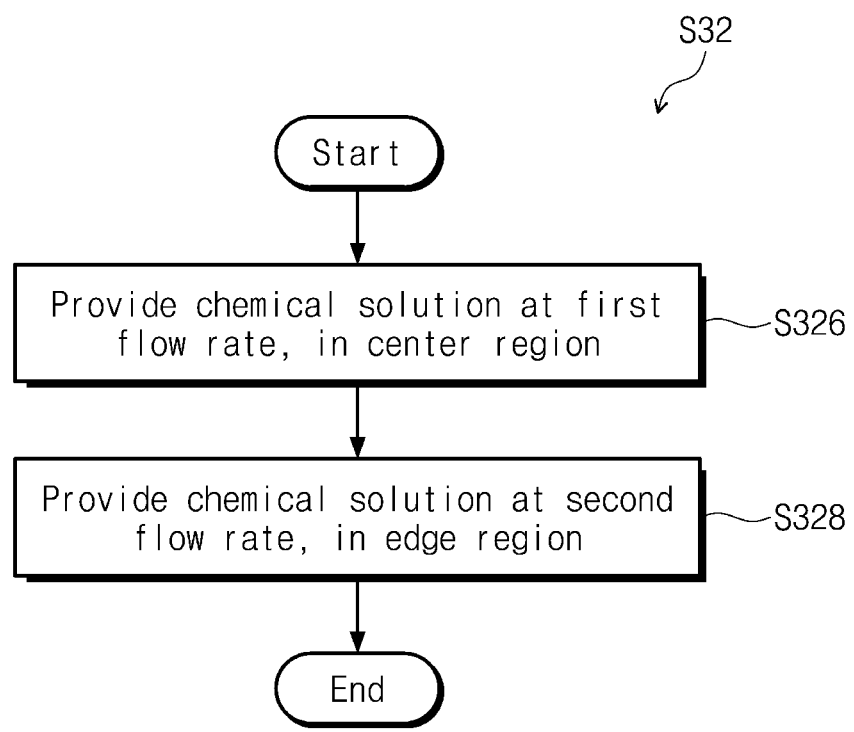
FIG. 18 is a flow chart illustrating an example of a step of providing the first spray and the first chemical solution of FIG. 3 on a substrate.
Figure 19:
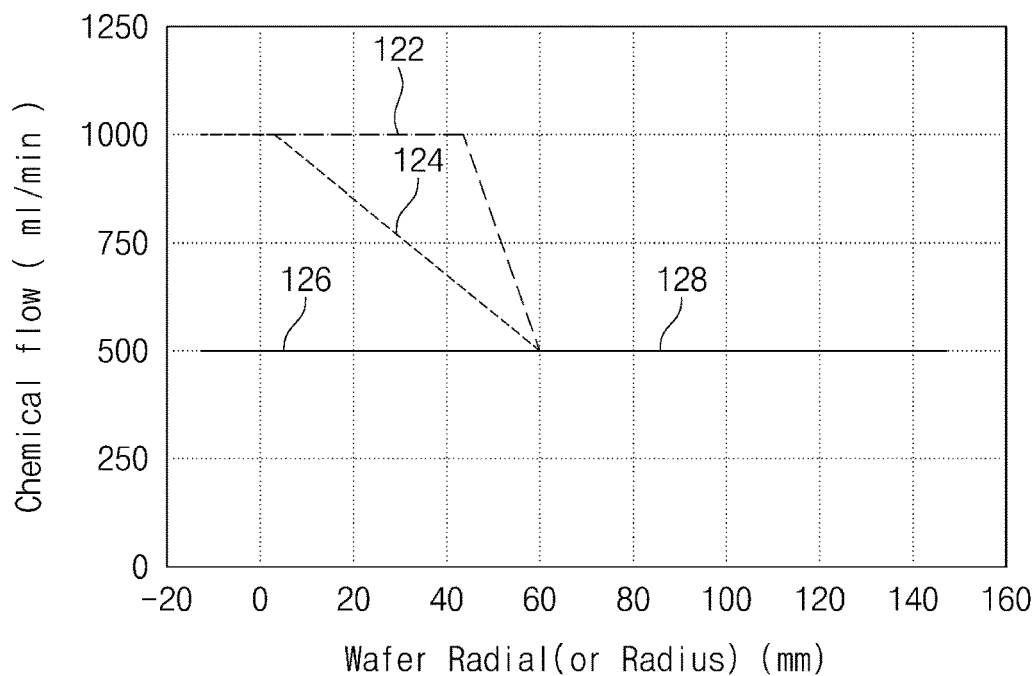
FIG. 19 is a graph illustrating an example of a first flow rate, a varying flow rate, a constant flow rate, and a second flow rate of the first chemical solution.

FIG. 18 illustrates an example of the step S32 of providing the first spray 68 and the first chemical solution 61 of FIG. 3 on the substrate W. FIG. 19 illustrates an example of a first flow rate 122, a varying flow rate 124, a constant flow rate 126, and a second flow rate 128 of the first chemical solution 61.

Referring to FIG. 18, the providing of the first spray 68 and the first chemical solution 61 on the substrate W (in S32) may include providing the first chemical solution 61 at a non-constant or varying flow rate.

Referring to FIGS. 18 and 19, the first low-pressure nozzle 67 of the first double nozzle 66 may provide the first chemical solution 61 to the center region C at the first flow rate 122 or the varying flow rate 124 (in S326). The first flow rate 122 may have a high flow rate of about 1000 ml/min. A typical flow rate 126, which is constant or does not vary, may be lower than the first flow rate 122. The constant flow rate 126 may be about 500 ml/min. The varying flow rate 124 may be decreased from the first flow rate 122 to the constant flow rate 126 near the edge of the center region C of the substrate W.

Thereafter, the first chemical solution 61 may be provided in the edge region E of the substrate W with the second flow rate 128 (in S328). The second flow rate 128 may be lower than the first flow rate 122. In addition, the second flow rate 128 may be equal to or smaller than the varying flow rate 124. That is, the varying flow rate 124 may be changed from the first flow rate 122 to the second flow rate 128. The second flow rate 128 may be equal to the constant flow rate 126. The second flow rate 128 may be about 500 ml/min.

Figure 20:
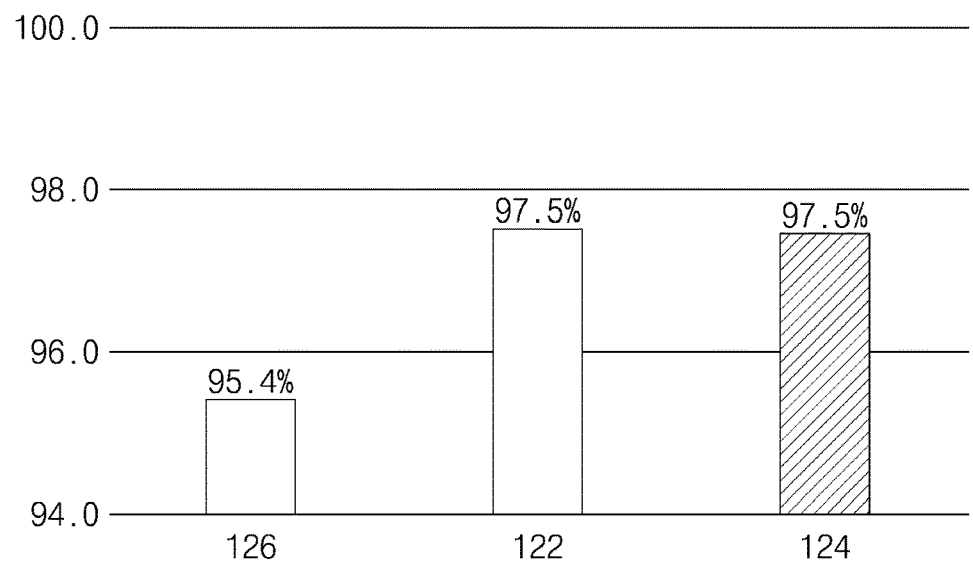
FIG. 20 is a graph showing a difference in particle removal efficiency according to the first flow rate, the varying flow rate, and the constant flow rate of FIG. 19.

FIG. 20 illustrates particle removal efficiency according to the first flow rate 122, the varying flow rate 124, and the constant flow rate 126 of FIG. 19.

Referring to FIG. 20, the particle removal efficiencies in the first flow rate 122 and the varying flow rate 124 were higher than the particle removal efficiency in the constant flow rate 126. Each of the particle removal efficiencies in the first flow rate 122 and the varying flow rate 124 was about 97.5%, and the particle removal efficiency in the constant flow rate 126 was about 95.4%.

Thus, according to an embodiment of the inventive concept, by providing the first flow rate 122 and the varying flow rate 124 at a non-constant or varying flow rate, it may be possible to increase the particle removal efficiency in the substrate cleaning method.

Figure 21:
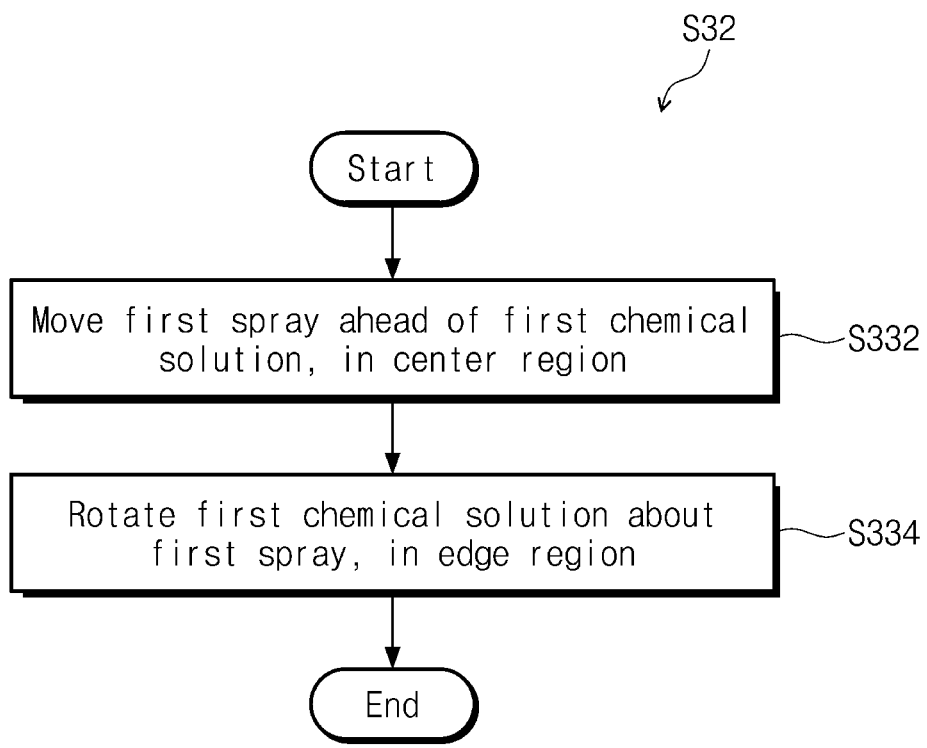
FIG. 21 is a flow chart illustrating an example of a step of providing the first spray and the first chemical solution of FIG. 3 on a substrate.
Figure 22:
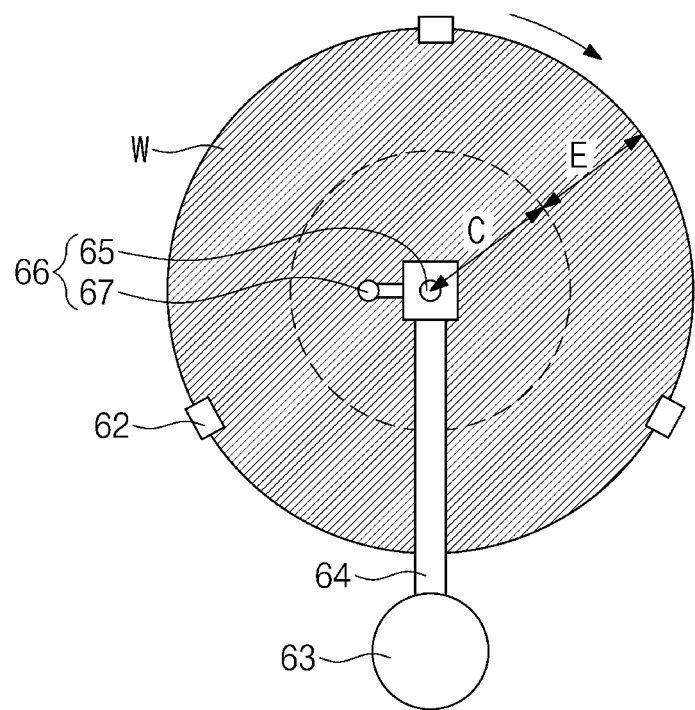
FIG. 22 is a plan view illustrating an example of a first double nozzle on the center region of the substrate of FIG. 14.
Figure 23:
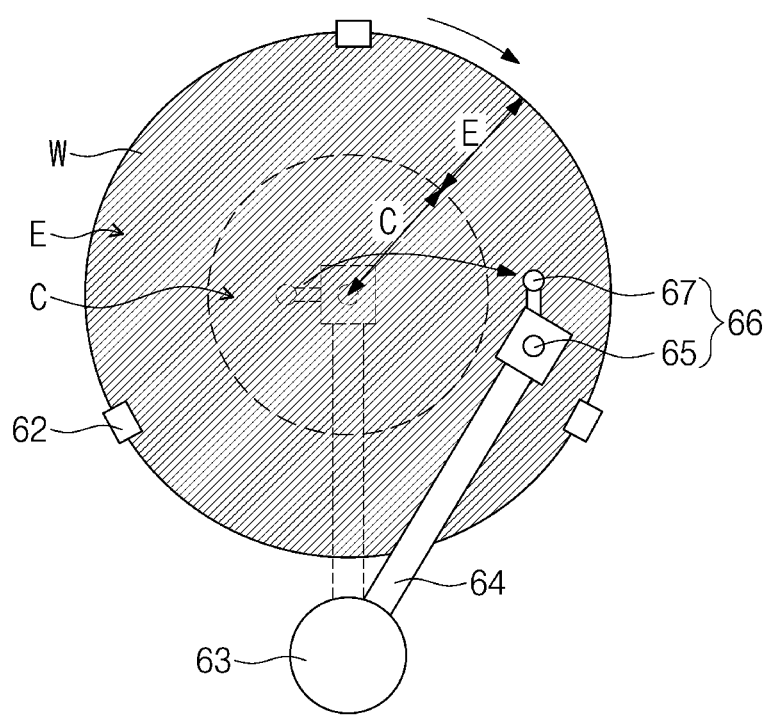
FIG. 23 is a plan view illustrating an example of the first double nozzle on the edge region of the substrate of FIG. 14.

FIG. 21 illustrates an example of the step S32 of providing the first spray 68 and the first chemical solution 61 of FIG. 3 on the substrate W. FIG. 22 illustrates an example of the first double nozzle 66 on the center region C of the substrate W of FIG. 14. FIG. 23 illustrates an example of the first double nozzle 66 on the edge region E of the substrate W of FIG. 14.

Referring to FIG. 21, the providing of the first spray 68 and the first chemical solution 61 on the substrate W (in S32) may include providing the first chemical solution 61 along a rotational (e.g., circular) path around the first spray 68 (i.e., in a rotating manner).

Referring to FIGS. 21 and 22, in the center region C of the substrate W, the first high-pressure nozzle 65 and the first low-pressure nozzle 67 of the first double nozzle 66 may move the first spray 68 in the second direction 69b (FIG. 4) ahead of the first chemical solution 61 (in S332). The first chemical solution 61 may be placed in the first direction 69a (FIG. 4) from the first spray 68, and the first chemical solution 61 and the first spray 68 may be moved in the second direction 69b that is opposite to the first direction 69a. The substrate W may be rotated in a clockwise direction.

Referring to FIGS. 21 and 23, the first low-pressure nozzle 67 may rotate about the first high-pressure nozzle 65 in the edge region E such that the first chemical solution 61 is rotated about the first spray 68 while being supplied onto the substrate W (in S334). The first chemical solution 61 may rotate in the same direction as the substrate W. For example, if the substrate W is rotated in a clockwise direction, the first chemical solution 61 may be rotated in the clockwise direction. In the edge region E of the substrate W, the first chemical solution 61 may be provided on the substrate W rotating in the clockwise direction, ahead of the first spray 68. In the edge region E of the substrate W, since the first chemical solution 61 is provided ahead of the first spray 68, it may be possible to reduce a thickness difference of the first chemical solution 61 in the edge region E. The first spray 68 may remove the particle 11 at a drop position of the first chemical solution 61, and in this case, it may be possible to more effectively perform the cleaning process and to reduce unnecessary consumption of the first chemical solution 61.

Referring back to FIGS. 8 and 10, the substrate W may be provided between the brushes 74, and the single nozzle 76 may provide the second chemical solution 71 on the substrate W (in S34). The brushes 74 may be used to lift some of the particles 11 from a surface of the substrate W, and the second chemical solution 71 may remove the lifted particle 11 to prevent the particle 11 from being absorbed onto the substrate W.

Referring to FIGS. 9 and 10, the second double nozzle 86 of the third cleaning portion 80 may provide the second spray 88 and the third chemical solution 81 on the substrate W (in S36). The second spray 88 and the third chemical solution 81 may be provided to be substantially the same as the first spray 68 and the first chemical solution 61. The second spray 88 may be provided on a region from the center of the substrate W to the edge of the substrate W, ahead of the third chemical solution 81. The third chemical solution 81 may lift the particle 11 from the substrate W, and the second spray 88 may remove the particle 11 from the substrate W using a hitting force exerted on the particle 11. In addition, the third chemical solution 81 and the particle 11 may be removed by the rotation of the substrate W. The second spray 88 and the third chemical solution 81 may be provided in such a way that a distance therebetween is smaller than the first distance D1. For example, the second spray 88 and the third chemical solution 81 may be spaced apart from each other by a distance of about 7 cm to about 12 cm. In the case where the distance between the second spray 88 and the third chemical solution 81 is smaller than about 7.5 cm, the particle removal efficiency may be maximally increased.

As an example, the providing of the second spray 88 and the third chemical solution 81 on the substrate W (in S36) may be performed in substantially the same manner as the providing of the first spray 68 and the first chemical solution 61 on the substrate W (in S32). For example, the providing of the second spray 88 and the third chemical solution 81 on the substrate W (in S36) may include providing the second spray 88 and the third chemical solution 81 at a non-constant moving speed, at a non-constant flow rate, at a varying flow rate, or in a rotating manner.

Referring back to FIGS. 1 and 10, the drying unit 50 may be configured to remove moisture from a surface of the substrate W or to dry the substrate W (in S40). The substrate W may be dried by a supercritical fluid. Alternatively, the substrate W may be dried by warm or hot air, but the inventive concept is not limited to this example.

In the substrate cleaning method according to an embodiment of the inventive concept, a chemical solution and a spray are provided to be spaced apart from each other by a distance of about 7 cm to about 12 cm, and in this case, it may be possible to improve particle removal efficiency.

While example embodiments of the inventive concept have been particularly shown and described, it will be understood by one of ordinary skill in the art that variations in form and detail may be made therein without departing from the scope of the attached claims.

What is claimed is:

1. A method of processing a substrate, comprising:
   preparing the substrate;
   polishing the substrate; and
   cleaning the substrate using a double nozzle comprising a high-pressure nozzle providing a spray and a low-pressure nozzle providing a chemical solution onto the substrate, the spray comprising a deionized water and the chemical solution being diluted with the deionized water,
   wherein the chemical solution and the spray are spaced apart from each other by a distance of 7 cm to 12 cm,
   wherein the spray is provided onto the substrate at a higher pressure than the chemical solution,
   wherein the cleaning of the substrate using the double nozzle comprises:
      moving the double nozzle at a first speed of 1.2 cm/sec to 5.0 cm/sec at a center region of the substrate; and
      moving the double nozzle at a second speed of 1.1 cm/sec or less at an edge region of the substrate that is outside and surrounds the center region of the substrate.

2. The method of claim 1, further comprising moving the double nozzle from the center region of the substrate toward the edge region of the substrate in a first direction, wherein the spray is provided ahead of the chemical solution in the first direction when the double nozzle is at the center region of the substrate.

3. The method of claim 1, wherein the cleaning the substrate using the double nozzle comprises providing the chemical solution and the spray in a non-uniform manner.

4. The method of claim 1, wherein the cleaning the substrate using the double nozzle comprises providing the chemical solution at a non-constant flow rate or a varying flow rate.

5. The method of claim 4, wherein the cleaning the substrate using the double nozzle comprises:
   providing the chemical solution at a first flow rate at the center region of the substrate; and
   providing the chemical solution at a second flow rate, which is lower than the first flow rate, at the edge region of the substrate outside and surrounding the center region of the substrate.

6. The method of claim 1, wherein the cleaning the substrate using the double nozzle comprises providing the chemical solution along a rotational path around the spray.

7. The method of claim 6, wherein the cleaning the substrate using the double nozzle comprises:
   moving the spray ahead of the chemical solution in the center region of the substrate; and
   rotating the chemical solution about the spray in the edge region of the substrate outside and surrounding the center region of the substrate.

8. The method of claim 7, wherein, when the substrate is rotated, the chemical solution is rotated in the same direction as the substrate.

9. The method of claim 1, further comprising brushing the substrate using a plurality of brushes.

10. A method of cleaning a substrate, comprising:
    moving a double nozzle comprising a high-pressure nozzle providing a spray onto the substrate and a low-pressure nozzle providing a chemical solution onto the substrate at a first speed of 1.2 cm/sec to 5.0 cm/sec on a center region of the substrate, the spray comprising a deionized water and the chemical solution being diluted with the deionized water; and
    moving the double nozzle at a second speed, which is slower than the first speed and is 1.1 cm/sec or less, on an edge region of the substrate outside and surrounding the center region of the substrate,
    wherein the spray is provided onto the substrate at a higher pressure than the chemical solution, and wherein the low-pressure nozzle and the high-pressure nozzle are spaced apart from each other by a distance of 7 cm to 12 cm.

11. The method of claim 10, wherein the chemical solution is provided on the center region of the substrate at a first flow rate and is provided on the edge region of the substrate at a second flow rate smaller than the first flow rate.

12. The method of claim 11, wherein, at the center region of the substrate, the chemical solution is provided at a varying flow rate from the first flow rate to the second flow rate.

13. The method of claim 10, wherein, at the center region of the substrate, as the double nozzle is moved from the center region of the substrate toward the edge region of the substrate in a first direction, the high-pressure nozzle is positioned ahead of the low-pressure nozzle in the first direction, and at the edge region of the substrate, the low-pressure nozzle is rotated about the high-pressure nozzle.

14. The method of claim 13, wherein, when the substrate is rotated, the low-pressure nozzle is rotated in the same direction as the substrate.

15. A method of processing a substrate, comprising:
preparing the substrate;
polishing the substrate; and
cleaning the substrate,
wherein the cleaning of the substrate comprises:
moving a first double nozzle comprising a high-pressure nozzle providing a first spray and a low-pressure nozzle providing a first chemical solution onto the substrate at a first speed of 1.2 cm/sec to 5.0 cm/sec on a center region of the substrate, the first spray comprising a deionized water, the first chemical solution being diluted with the deionized water; and
moving the first double nozzle at a second speed of 1.1 cm/sec or less on an edge region of the substrate outside and surrounding the center region of the substrate;
brushing the substrate using a brush and a second chemical solution, which is different from the first chemical solution, on the substrate; and
recleaning the substrate using a second double nozzle, which is configured to provide a second spray and a third chemical solution onto the substrate, which are the same as the first spray and the first chemical solution, respectively,
wherein a distance between the first chemical solution and the first spray and a distance between the second spray and the third chemical solution are each in a range of 7 cm to 12 cm.

16. The method of claim 15, wherein the cleaning of the substrate using the first double nozzle comprises:
providing the first chemical solution at a first flow rate, at the center region of the substrate; and
providing the first chemical solution at a second flow rate, which is lower than the first flow rate, at the edge region of the substrate outside and surrounding the center region of the substrate.

17. The method of claim 16, wherein the first chemical solution is provided at a varying flow rate from the first flow rate to the second flow rate, at the center region of the substrate.

18. The method of claim 15, further comprising moving the first double nozzle in a first direction from the center region of the substrate to the edge region of the substrate, wherein the cleaning of the substrate using the first double nozzle comprises:
moving the first spray ahead of the first chemical solution in the first direction, at the center region of the substrate; and
rotating the first chemical solution about the first spray, at the edge region of the substrate.

* * * * *